United States Patent
Kennan

(10) Patent No.: US 7,336,127 B2
(45) Date of Patent: Feb. 26, 2008

(54) DOHERTY AMPLIFIER CONFIGURATION FOR A COLLECTOR CONTROLLED POWER AMPLIFIER

(75) Inventor: Wayne Kennan, Palo Alto, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 179 days.

(21) Appl. No.: 11/149,682

(22) Filed: Jun. 10, 2005

(65) Prior Publication Data
US 2007/0139105 A1    Jun. 21, 2007

(51) Int. Cl.
H03F 3/68 (2006.01)
(52) U.S. Cl. ............... 330/124 R; 330/127; 330/295
(58) Field of Classification Search ............ 330/53, 330/84, 98, 124 R, 295, 310
See application file for complete search history.

(56) References Cited

U.S. PATENT DOCUMENTS

| | | | |
|---|---|---|---|
| 4,446,440 A | 5/1984 | Bell | 330/10 |
| 4,701,957 A | 10/1987 | Smith | 381/61 |
| 4,739,759 A | 4/1988 | Rexroth | 128/303.14 |
| 5,126,688 A | 6/1992 | Nakanishi et al. | 330/285 |
| 5,182,527 A | 1/1993 | Nakanishi et al. | 330/285 |
| 5,204,637 A | 4/1993 | Trinh | 330/129 |
| 5,251,330 A | 10/1993 | Chiba et al. | 455/91 |
| 5,276,917 A | 1/1994 | Vanhanen et al. | 455/89 |
| 5,438,683 A | 8/1995 | Durtler et al. | 455/74 |
| 5,442,322 A | 8/1995 | Kornfeld et al. | 330/285 |
| 5,493,255 A | 2/1996 | Murtojarvi | 330/296 |
| 5,511,234 A | 4/1996 | Ha | 455/127 |
| 5,530,404 A | 6/1996 | Debroux | 330/278 |
| 5,530,923 A | 6/1996 | Heinonen et al. | 455/126 |
| 5,553,318 A | 9/1996 | Ohmagari et al. | 455/126 |
| 5,559,471 A | 9/1996 | Black | 330/277 |
| 5,561,395 A | 10/1996 | Melton et al. | 330/2 |

(Continued)

FOREIGN PATENT DOCUMENTS

EP    0 626 765 A1    11/1994

(Continued)

OTHER PUBLICATIONS

International Search Report for PCT/US2006/021452 mailed Oct. 16, 2006.

(Continued)

Primary Examiner—Khanh Van Nguyen
(74) Attorney, Agent, or Firm—Withrow & Terranova, PLLC

(57) ABSTRACT

An efficient power amplifier circuitry for a mobile terminal or similar wireless communication device is provided. The power amplifier circuitry includes an output stage configured as a collector controlled Doherty amplifier, wherein the collector controlled Doherty amplifier increases the efficiency of the power amplifier at backoff power levels. The output stage includes main and peaking amplifiers connected in parallel and operating 90 degrees out-of-phase. The main amplifier is controlled using a first variable supply voltage, and the peaking amplifier is controlled using a second variable supply voltage. The first and second variable supply voltages are provided such that the main amplifier is active and the peaking amplifier is inactive for output power levels less than a predetermined backoff from a maximum output power level, and both the main amplifier and peaking amplifiers are active and operating in concert for output power levels greater than the predetermined backoff.

18 Claims, 7 Drawing Sheets

U.S. PATENT DOCUMENTS

| | | | | |
|---|---|---|---|---|
| 5,574,991 | A | 11/1996 | Miyama et al. | 455/126 |
| 5,606,284 | A | 2/1997 | Tamesue et al. | 330/129 |
| 5,608,353 | A | 3/1997 | Pratt | 330/295 |
| 5,621,354 | A | 4/1997 | Mitzlaff | 330/52 |
| 5,629,648 | A | 5/1997 | Pratt | 330/289 |
| 5,715,527 | A | 2/1998 | Horii et al. | 455/126 |
| 5,808,453 | A | 9/1998 | Lee et al. | 323/224 |
| 5,828,692 | A | 10/1998 | Walley et al. | 375/130 |
| 5,831,477 | A | 11/1998 | Tsumura | 330/51 |
| 5,834,975 | A | 11/1998 | Bartlett et al. | 330/278 |
| 5,847,602 | A | 12/1998 | Su | 330/10 |
| 5,861,776 | A | 1/1999 | Swanson | 330/124 R |
| 5,862,461 | A | 1/1999 | Yoshizawa et al. | 455/127 |
| 5,870,296 | A | 2/1999 | Schaffer | 363/65 |
| 5,872,481 | A | 2/1999 | Sevic et al. | 330/51 |
| 5,942,946 | A | 8/1999 | Su et al. | 330/310 |
| 5,973,556 | A | 10/1999 | Su | 330/10 |
| 5,977,833 | A | 11/1999 | Attimont et al. | 330/297 |
| 5,994,963 | A | 11/1999 | Kawai et al. | 330/277 |
| 6,002,923 | A | 12/1999 | Sahlman | 455/118 |
| 6,025,753 | A | 2/2000 | Landherr et al. | 330/285 |
| 6,043,707 | A | 3/2000 | Budnik | 330/10 |
| 6,049,704 | A | 4/2000 | Peckham et al. | 455/232.1 |
| 6,069,530 | A | 5/2000 | Clark | 330/149 |
| 6,101,224 | A | 8/2000 | Lindoff et al. | 375/300 |
| 6,137,274 | A | 10/2000 | Rajagopalan | 323/272 |
| 6,148,220 | A | 11/2000 | Sharp et al. | 455/572 |
| 6,160,855 | A | 12/2000 | Nakamura et al. | 375/280 |
| 6,188,877 | B1 | 2/2001 | Boesch et al. | 455/74 |
| 6,198,347 | B1 | 3/2001 | Sander et al. | 330/251 |
| 6,285,251 | B1 * | 9/2001 | Dent et al. | 330/124 R |
| RE37,407 | E | 10/2001 | Eisenberg et al. | 330/2 |
| 6,313,705 | B1 | 11/2001 | Dening et al. | 330/276 |
| 6,327,462 | B1 | 12/2001 | Loke et al. | 455/127 |
| 6,356,745 | B1 | 3/2002 | Lee et al. | 455/232.1 |
| 6,366,177 | B1 | 4/2002 | McCune et al. | 332/103 |
| 6,369,649 | B2 | 4/2002 | Nakajima | 330/51 |
| 6,374,127 | B1 | 4/2002 | Park | 455/572 |
| 6,377,784 | B2 | 4/2002 | McCune | 455/108 |
| 6,392,488 | B1 | 5/2002 | Dupuis et al. | 330/277 |
| 6,397,090 | B1 | 5/2002 | Cho | 455/574 |
| 6,405,054 | B1 | 6/2002 | Rozenblit et al. | 455/522 |
| 6,414,469 | B1 | 7/2002 | Zhou et al. | 323/272 |
| 6,441,694 | B1 | 8/2002 | Turcotte et al. | 332/100 |
| 6,445,249 | B1 | 9/2002 | Khan et al. | 330/149 |
| 6,448,847 | B1 | 9/2002 | Paul et al. | 327/563 |
| 6,462,620 | B1 | 10/2002 | Dupuis et al. | 330/264 |
| 6,549,071 | B1 | 4/2003 | Paul et al. | 330/252 |
| RE38,140 | E | 6/2003 | Schaffer | 363/65 |
| 6,701,138 | B2 | 3/2004 | Epperson et al. | 455/127 |
| 6,734,724 | B1 | 5/2004 | Schell et al. | 330/10 |
| 6,844,776 | B2 | 1/2005 | Schell et al. | 330/10 |
| 6,969,978 | B2 | 11/2005 | Dening | 323/282 |
| 2001/0006355 | A1 | 7/2001 | Park | 330/285 |
| 2002/0002038 | A1 | 1/2002 | Seawright et al. | 455/127 |
| 2002/0077066 | A1 | 6/2002 | Pehlke et al. | 455/73 |
| 2002/0127980 | A1 | 9/2002 | Amanullah et al. | 455/127 |
| 2003/0054778 | A1 | 3/2003 | Hecht | 455/115 |
| 2003/0083026 | A1 | 5/2003 | Liu | 455/127 |
| 2003/0090325 | A1 | 5/2003 | Canyon et al. | 330/285 |
| 2003/0197574 | A1 | 10/2003 | Ishida et al. | |
| 2004/0051583 | A1 | 3/2004 | Hellberg | |
| 2004/0108900 | A1 * | 6/2004 | Apel | 330/285 |

FOREIGN PATENT DOCUMENTS

| | | |
|---|---|---|
| JP | 61095603 | 5/1986 |
| JP | 5235657 | 9/1993 |

OTHER PUBLICATIONS

Hanington et al., "Microwave Power Amplifier Efficiency Improvement With a 10 MHz HBT DC-DC Converter," 1998 IEEE MTT-S International Microwave Symposium Digest, 1998.

International Search Report for counterpart application PCT/US02/16636, mailed Dec. 2, 2003.

P. Asbeck et al., " Efficiency and Linearity Improvement in Power Amplifiers for Wireless Communications," University of California, San Diego, La Jolla, CA, IEEE 1998, pp. 15-18.

F. Raab et al., "Power Amplifiers and Transmitters for RF and Microwave," IEEE Transactions on Microwave Theory and Techniques, vol. 50, No. 3, pp. 814-826, Mar. 2002.

S. Cripps, "Advanced Techniques in RF Power Amplifier Design," Artech House, Inc., ch. 2, pp. 33-72, 2002.

M. Iwamoto et al., "An Extended Doherty Amplifier With High Efficiency Over a Wide Power Range," IEEE Transactions on Microwave Theory and Techniques, vol. 49, No. 12, Dec. 2001.

* cited by examiner

DOHERTY AMPLIFIER CONFIGURATION FOR A COLLECTOR CONTROLLED POWER AMPLIFIER

FIELD OF THE INVENTION

The present invention relates to a power amplifier for a wireless communication device and more particularly a final stage for a power amplifier having a collector controlled Doherty amplifier configuration.

BACKGROUND OF THE INVENTION

In recent years, worldwide demand for wireless cellular communications has increased dramatically. Mobile terminals manufactured to meet this burgeoning demand must adhere to standards such as the Global System for Mobile Communications (GSM) standard. The Digital Cellular System (DCS) standard is based on GSM, but is directed towards higher cell density and lower power. A third standard, Personal Communications Services (PCS), is a "catch all" for many digital cellular systems, including GSM, operating in North America. These standards all require precise output power control over a large dynamic range in order to prevent a transmitter located in one cell from interfering with the reception of transmissions from other transmitters in neighboring cells.

Accordingly, a key component common to all mobile terminals is a radio frequency (RF) power amplifier. In operation, power amplifiers receive as input a frequency or phase modulated radio frequency carrier and amplify the radio frequency carrier to a level sufficient for reception by a cellular base station. However, due to its inherent nature, the power amplifier requires a significant amount of power and is a primary factor in determining the battery-life of the mobile terminal. The power consumption of the power amplifier and thus the mobile terminal is dependent upon a Power Added Efficiency (PAE) of the power amplifier. Since one of the primary goals in designing mobile terminals is to reduce power consumption in order to increase battery-life, there remains a need for a power amplifier having increased PAE, which leads to increased battery-life for the mobile terminal.

SUMMARY OF THE INVENTION

The present invention provides efficient power amplifier circuitry for a mobile terminal or other wireless communication device. The power amplifier circuitry includes an output stage configured as a collector controlled Doherty amplifier, which increases the efficiency of the power amplifier at backoff power levels. The output stage includes main and peaking amplifiers connected in parallel and operating 90 degrees out-of-phase. The main amplifier is controlled using a first variable supply voltage, and the peaking amplifier is controlled using a second variable supply voltage. The first and second variable supply voltages are provided such that the main amplifier is active and the peaking amplifier is inactive for output power levels less than a predetermined backoff from a maximum output power level, and both the main amplifier and peaking amplifiers are active and operating in concert for output power levels greater than the predetermined backoff.

Power control circuitry provides the first variable supply voltage based on an adjustable power control signal. For output power levels less than the predetermined backoff, the first variable supply voltage is a function of the adjustable power control signal and increases from a minimum value to a maximum value as the adjustable power control signal increases from a minimum value to a value corresponding to the predetermined backoff. For output power levels greater than the predetermined backoff, the first variable supply voltage is essentially equal to the maximum value. However, as a result of the activation of the peaking amplifier for output power levels greater than the predetermined backoff, an active loading effect of the Doherty arrangement reduces the load impedance seen by the main amplifier such that an output current of the main amplifier increases even though the first variable supply voltage remains constant.

The power control circuitry provides the second variable supply voltage as a function of the adjustable power control signal such that the peaking amplifier is inactive for output power levels less than the predetermined backoff and active for output power levels greater than the predetermined backoff. More specifically, the second variable supply voltage increases as a function of the adjustable power control signal as the output power increases from a minimum value to the maximum output power. For output power levels less than the predetermined backoff, the second variable supply voltage is less than a threshold voltage of the peaking amplifier such that the peaking amplifier remains inactive. For output power levels greater than the predetermined backoff, the second variable supply voltage continues to increase as a function of the adjustable supply voltage such that the peaking amplifier is activated and provides a maximum output current at the maximum output power level.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
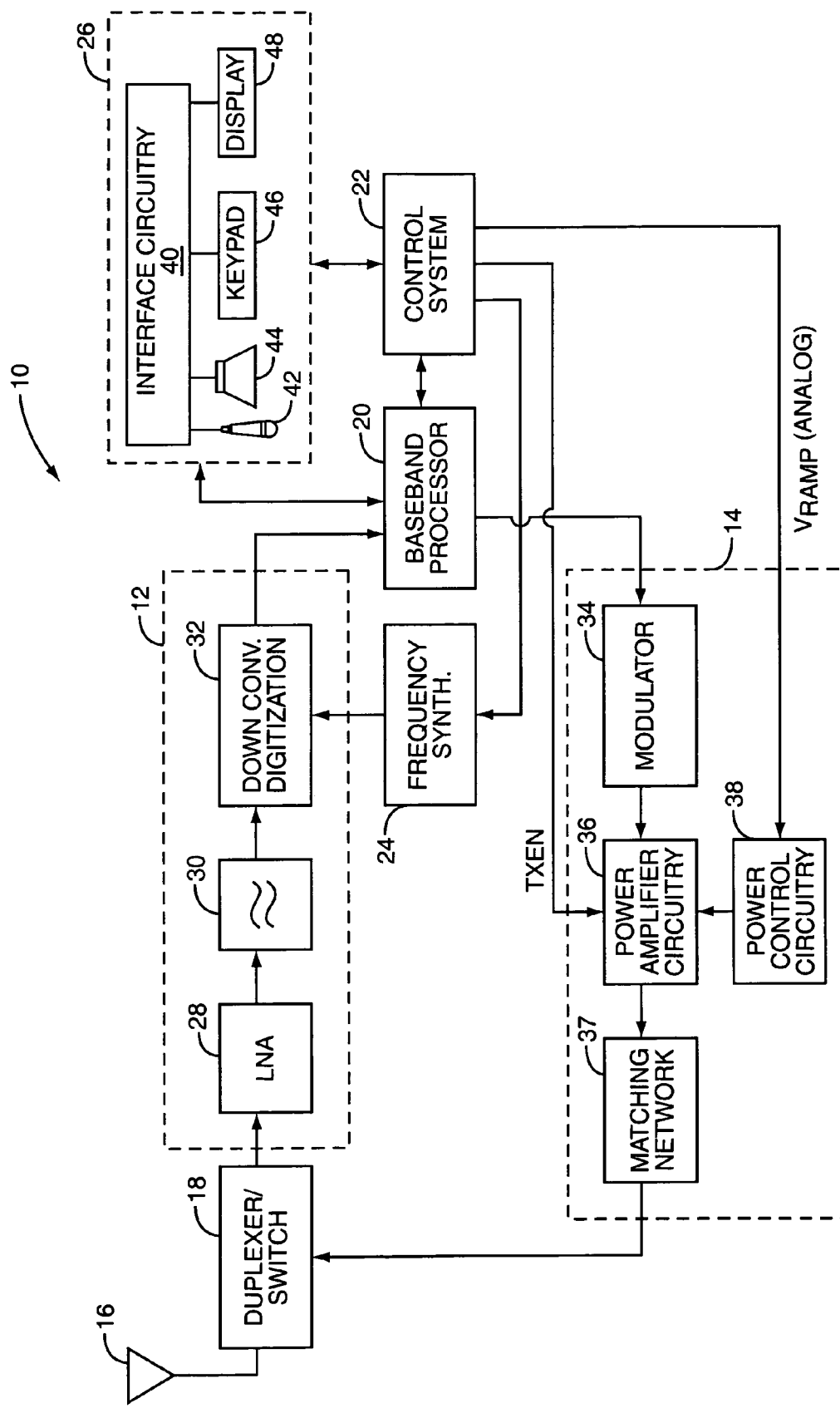
FIG. 1 illustrates an exemplary block diagram of a mobile terminal according to one embodiment of the present invention.

The present invention is preferably incorporated in a mobile terminal 10, such a mobile telephone, personal digital assistant, or the like. The present invention may also be incorporated in a wireless local area network (WLAN) device, a base station for a wireless network, or other portable wireless communication device. The basic architecture of a mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier (LNA) 28 amplifies the signal. Filtering circuitry 30 minimizes broadband interference in the received signal, while downconversion and digitization circuitry 32 downconverts the filtered, received signal to an intermediate or baseband frequency signal and digitizes the intermediate or baseband frequency signal into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission from the antenna 16, and delivers the modulated carrier signal to antenna 16 through a matching network 37.

As described in further detail below, the power amplifier circuitry 36 provides gain for the signal to be transmitted under control of power control circuitry 38, which may be controlled by the control system 22 using an adjustable power control signal ($V_{RAMP}$). Alternatively, the adjustable power control signal ($V_{RAMP}$) may be generated within the radio frequency transmitter section 14 based on combining a power amplifier gain (PAG) setting from the control system 22 and a ramping signal, where the power amplifier gain (PAG) setting adjusts a magnitude of the ramping signal to provide the adjustable power control signal ($V_{RAMP}$).

In yet another embodiment, the modulator 34 may operate according to one or more modulation schemes. For example, the modulator 34 may operate according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme according to the Global System for Mobile Communications (GSM) standard. The modulation scheme of the modulator 34 may be controlled by the control system 22.

When in 8PSK mode, the modulator 34 provides a phase component ($\phi$) at a desired transmit frequency to the power amplifier circuitry 36 and the adjustable power control signal ($V_{RAMP}$) including an amplitude modulation component (r) to the power control circuitry 38. More specifically, the modulator 34 combines the power amplifier gain (PAG) setting, the ramping signal, and the amplitude modulation component (r) to provide the adjustable power control signal ($V_{RAMP}$). When in GMSK mode, the modulator 34 provides a phase modulated signal to the power amplifier circuitry 36 and the adjustable power control signal ($V_{RAMP}$) to the power control circuitry 36. In this embodiment, the adjustable power control signal ($V_{RAMP}$) is provided by combining the power amplifier gain (PAG) setting and the ramping signal. However, in GMSK mode, the adjustable power control signal ($V_{RAMP}$) does not include an amplitude modulation component.

In one embodiment, the bias for the power amplifier circuitry 36 is relatively stable regardless of power, and varying the voltage supplied to the power amplifier circuitry 36 controls the output power of the power amplifier circuitry 36. In addition, the control system 22 may also provide a transmit enable signal (TXEN) to effectively enable the power amplifier circuitry 36 during periods of transmission.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 44 by the I/O and interface circuitry 40. The keypad 46 and display 48 enable the user to interact with the mobile terminal 10, input numbers to be dialed, address book information, or the like, as well as monitor call progress information.

Figure 2:
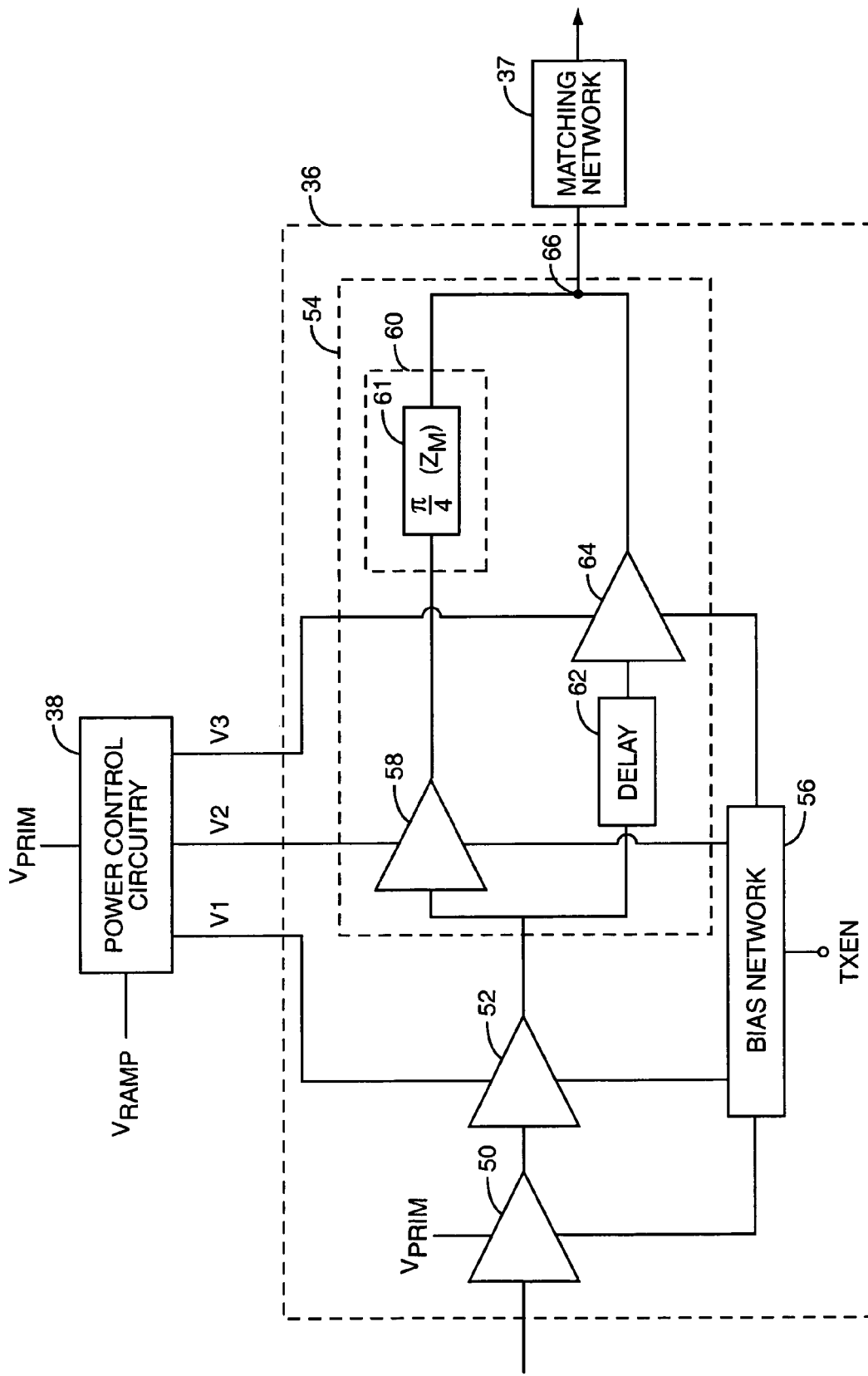
FIG. 2 illustrates one embodiment of the power amplifier circuitry of the present invention.

FIG. 2 illustrates one embodiment of the power amplifier circuitry 36 of the present invention. This embodiment is similar to that disclosed in commonly owned U.S. Pat. No. 6,701,138 entitled POWER AMPLIFIER CONTROL, issued Mar. 2, 2004, which is hereby incorporated by reference in its entirety. In general, the power amplifier circuitry 36 is associated with power control circuitry 38. The power amplifier circuitry 36 may comprise any number of amplifier stages. In this embodiment, the power amplifier circuitry 36 includes three amplifier stages, an input amplifier stage 50, an intermediate amplifier stage 52, and an output amplifier stage 54, as well as a bias network 56 providing bias for each of the three amplifier stages 50, 52, and 54. In alternate embodiments, the bias network 56 may comprise multiple bias networks, one for each amplifier stage. In one embodiment, the bias provided to each stage 50, 52, and 54 is relatively constant regardless of output power. Other bias arrangements are also possible, as will be apparent to one of ordinary skill in the art upon reading this disclosure.

The input and intermediate amplifier stages 50, 52 are driver stages. In this embodiment, the input amplifier stage 50 receives a fixed, or constant, supply voltage ($V_{PRIM}$), which may be a positive supply terminal of a battery of the mobile terminal 10 (FIG. 1). The intermediate amplifier stage 52 receives a variable supply voltage V1 from the power control circuitry 38. The output amplifier stage 54 is a final, output stage that operates based on variable supply voltages V2 and V3, as described below in detail.

According to the present invention, the output amplifier stage 54 is a collector, or drain, controlled Doherty amplifier. The output amplifier stage 54 may be implemented using Bipolar Junction Transistors (BJTs), Field Effect Transistors (FETs), or any other type of transistor. As used herein, collector control generally refers to collector control of BJTs or drain control of FETs. The operation of a Doherty amplifier will be apparent to one of ordinary skill in the art. Amplifiers are most efficient when operating in saturation at high output power levels. However, if the amplifier is controlled such that it remains in saturation for all output power levels, the amplifier becomes increasingly inefficient as the output power is decreased from a maximum output power level. By implementing the output amplifier stage 54 in a Doherty amplifier configuration, the present invention provides improved efficiency over the entire output power range.

Traditional Doherty amplifiers are controlled via a bias voltage supplied to the base, or gate, of the transistors forming the Doherty amplifier. However, base, or gate, control has proven to be unacceptable for many applications because it does not provide precise control of the Doherty amplifier. According to the present invention, the Doherty amplifier forming the output amplifier stage 54 is controlled via variable supply voltages V2 and V3 from the power control circuitry 38. By using collector, or drain, control of the output stage 54, precise control of the operation of the Doherty amplifier forming the output amplifier stage 54 is achieved.

As illustrated in FIG. 2, the output amplifier stage 54 includes a main branch formed by main amplifier 58 and impedance (Z) inverter circuitry 60, and a peaking, or auxiliary, branch formed by delay circuitry 62 and peaking amplifier 64. The impedance inverter circuitry 60 is alternatively referred to as an impedance transformer. The main and peaking branches are arranged in parallel and operate essentially 90 degrees out-of-phase. More specifically, an amplified signal from the output of the intermediate stage amplifier 52 is provided to the main amplifier 58 and the delay circuitry 62. The delay circuitry 62 delays the amplified signal such that the delayed version of the amplified signal provided to the peaking amplifier 64 is essentially 90 degrees out-of-phase with the amplified signal provided to the main amplifier 58. In one embodiment, the delay circuitry 62 is a quarter wave transmission line. Alternatively, the amplified signal from the intermediate amplifier stage 52 may be provided to a quadrature splitter, which is also referred to as a 90 degree hybrid, where an in-phase output of the quadrature splitter is provided to the main amplifier 58, and the quadrature-phase output of the quadrature splitter is provided to the peaking amplifier 64.

The output of the main amplifier 58 is provided to the impedance inverter circuitry 60, which adjusts the phase of the output signal from the main amplifier 58 such that the output of the impedance inverter circuitry 60 is in-phase with the output of the peaking amplifier 64. In one embodiment, the impedance inverter circuitry 60 is a quarter wave transmission line 61 having a characteristic impedance, $Z_M$. The impedance inverter circuitry 60 operates as an active load such that the loads seen by the main and peaking amplifiers 58 and 64 are dependent on the radio frequency currents provided by the main and peaking amplifiers 58 and 64. The outputs of the main branch and peaking branch are combined at node 66 to provide an amplified radio frequency signal to the antenna 16 (FIG. 1) for transmission.

The power control circuitry 38 provides the variable supply voltages V2 and V3 such that the main amplifier 58 is active and the peaking amplifier 64 is inactive for output power levels up to a predetermined backoff point from below a maximum output power. For a symmetric arrangement, where the main amplifier 58 and the peaking amplifier 64 are essentially the same, the predetermined backoff point is 6 dB below the maximum output power, which is referred to herein as a 6 dB backoff point. For output power levels above the 6 dB backoff point, the power control circuitry 38 provides the variable supply voltages V2 and V3 such that the main amplifier 58 remains active and the peaking amplifier 64 is activated from being essentially inactive at 6 dB backoff to being fully active at the maximum output power. Note that in the preferred embodiment, the supply voltages V2 and V3 are provided such that both the main and peaking amplifiers 58 and 64 operate in saturation when active. However, in applications such as CDMA or W-CDMA, the main and peaking amplifiers 58 and 64 may be controlled for linear operation.

While the Doherty configuration of the output amplifier stage 54 appears to be a 90 degree balanced amplifier, it is in fact an active load pull system where the radio frequency current output from the peaking amplifier 64 affects the load presented to the main amplifier 58, and vice versa. In operation, the main and peaking amplifiers 58 and 64 are working in concert and driving a load of, for example, approximately 4 ohms with very high efficiency at the maximum output power level. At a predetermined backoff point such as a 6 dB backoff from the maximum output power, the peaking amplifier 64 is inactive and the main amplifier 58 is driving a load of, for example, approximately 8 ohms with very high efficiency.

Assuming a symmetric configuration and that the characteristic impedance, $Z_M$, of the quarter wave transmission line 61 is two times a load impedance seen at the output of the output amplifier stage 54, the load impedances seen by the main and peaking amplifiers 58 and 64 at the maximum output power level may be defined as:

$R_{MAIN} = 2R_L$, and $R_{PEAKING} = 2R_L$, where $R_{MAIN}$ is the load seen by the main amplifier 58, $R_{PEAKING}$ is the load seen by the peaking amplifier 64, and $R_L$ is the load impedance at the output of the output amplifier stage 54. The load impedances seen by the main and peaking amplifiers 58 and 64 when operating below the 6 dB backoff point may be defined as:

$R_{MAIN} = 4R_L$, and $R_{PEAKING} \approx \infty$.

When operating at a point between the 6 dB backoff point and the maximum output power, both the main and peaking amplifiers 58 and 64 are active and the load impedance may be defined as:

$$R_{MAIN} = \frac{2R_L}{i_{MAIN}/i_{MAX}}, \text{ and}$$

$$R_{PEAKING} = \frac{R_L(i_{MAIN}/i_{MAX})}{i_{MAIN}/i_{MAX} - 1/2}, \text{ where}$$

$i_{MAIN}$ is the current output by the main amplifier 58, $i_{PEAKING}$ is the current output by the peaking amplifier 64, and $i_{MAX}$ is the maximum output current provided by the main and peaking amplifiers 58 and 64 at the maximum output power level.

Figure 3:
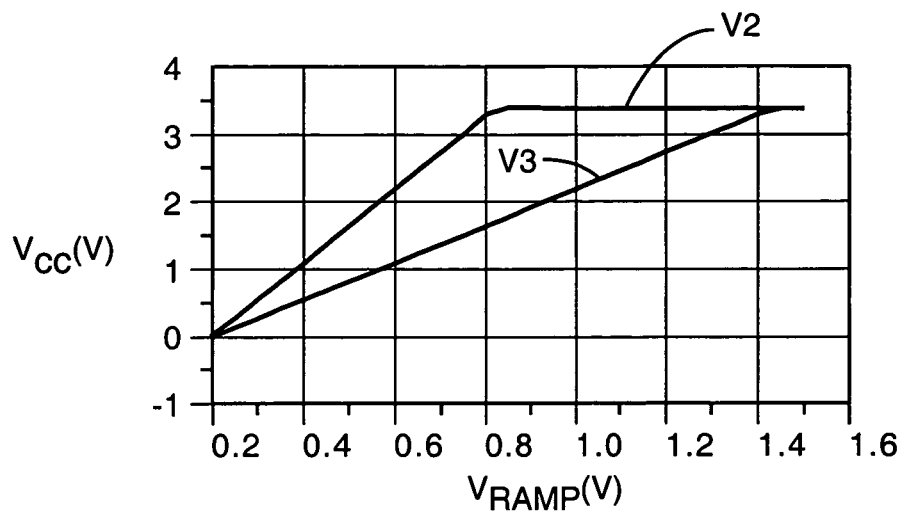
FIG. 3 is an exemplary graphical illustration of variable supply voltages used to control main and peaking amplifiers of the output stage of the power amplifier circuitry of FIG. 2 as a function of an adjustable power control signal ($V_{RAMP}$)

FIG. 3 is an exemplary illustration of the variable supply voltages V2 and V3 provided by the power control circuitry 38 to control the operation of the main and peaking amplifiers 58 and 64, respectively, of the output amplifier stage 54 of FIG. 2. In this example, when the adjustable power control signal ($V_{RAMP}$) is approximately 0.85 V, the output power is approximately 6 dB below the maximum output power level. As shown, the power control circuitry 36 provides the variable supply voltage V2 such that it increases until the output power level reaches the 6 dB backoff point. As the output power level increases above the 6 dB backoff point, the power control circuitry 38 operates to hold the variable supply voltage V2 essentially constant. Even though the variable supply voltage V2 remains constant for output power levels greater than the 6 dB backoff point, the current provided by the main amplifier 58 increases due to the active loading effect of the impedance inverter circuitry 60. More specifically, as the output power increases above the 6 dB backoff point, the load impedance seen by the main amplifier 58 decreases due to the increase in current from the peaking amplifier 64 and the active loading effect of the impedance inverter circuitry 60. As a result, the current provided by the main amplifier 58 increases even though the variable supply voltage V2 remains constant.

As for the variable supply voltage V3 provided to the peaking amplifier 64 (FIG. 2), the power control circuitry 38 operates to increase the supply voltage V3 as a function of the adjustable power control signal ($V_{RAMP}$). The variable supply voltage V3 is provided such that the variable supply voltage V3 is equal to a threshold voltage of the peaking amplifier 64 at the 6 dB backoff point. In this embodiment, the threshold voltage is approximately 1.75 V, and the 6 dB backoff point corresponds to a value of approximately 0.85 V for the adjustable power control signal ($V_{RAMP}$). When the variable supply voltage V3 is below the threshold voltage, the load impedance presented to the peaking amplifier 64 is infinite. Therefore, there is essentially no current provided by the peaking amplifier 64. When the variable supply voltage V3 is above the threshold voltage, the load impedance seen by the peaking amplifier 64 is no longer infinite, and the peaking amplifier 64 begins to provide current. Thus, the peaking amplifier 64 is essentially inactive, or off, when the output power level is less than the 6 dB backoff point. As the adjustable power control signal ($V_{RAMP}$) increases such that the output power level increases above the 6 dB backoff point, the variable supply voltage V3 continues to increase, thereby activating the peaking amplifier 64. The output currents of the main and peaking amplifiers 58 and 64 reach a maximum when the output power level is equal to the maximum output power level.

Figure 4:
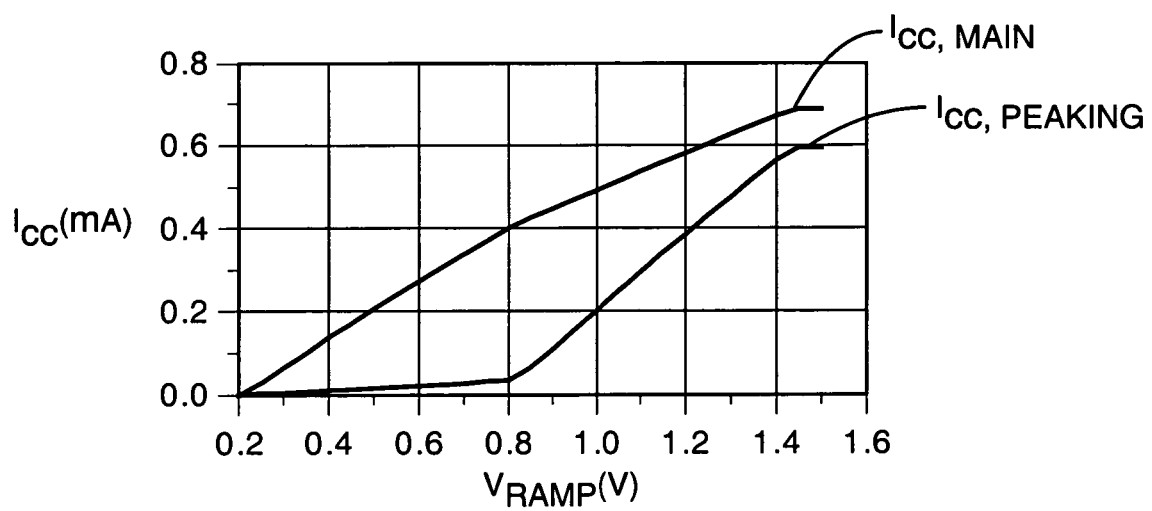
FIG. 4 is an exemplary graphical illustration of the currents provided by the main and peaking amplifiers of the output stage of the power amplifier circuitry of FIG. 2 as a function of an adjustable power control signal ($V_{RAMP}$)

FIG. 4 is an exemplary illustration of the collector, or drain, current of the main and peaking amplifiers 58 and 64 as a function of the adjustable power control signal ($V_{RAMP}$). As illustrated, the collector current ($I_{CC,\ MAIN}$) for the main amplifier 58 (FIG. 2) increases as the adjustable power control signal ($V_{RAMP}$) increases from 0 to approximately 0.85 V, where 0.85 V corresponds to the 6 dB backoff point for this example. As the adjustable power control signal ($V_{RAMP}$) increases above 0.85 V, the collector current ($I_{CC,\ MAIN}$) continues to increase even though the variable supply voltage V2 (FIG. 3) is essentially constant when the adjustable power control signal ($V_{RAMP}$) is above 0.85 V. The increase in the collector current ($I_{CC,\ MAIN}$) when the adjustable power control signal ($V_{RAMP}$) is above 0.85 V is due to the active load effect of the impedance inverter circuitry 60 (FIG. 2). More specifically, when the adjustable power control signal ($V_{RAMP}$) is above 0.85 V, the output power level is above the 6 dB backoff point and the peaking amplifier 64 is activated. The radio frequency current provided by the peaking amplifier 64 causes the load seen by the main amplifier 58 to decrease. As a result of the decrease in the load seen by the main amplifier 58, the collector current ($I_{CC,\ MAIN}$) increases. Accordingly, the collector current ($I_{CC,\ MAIN}$) increases as the output power level increases above the 6 dB backoff point even though the variable supply voltage V2 is essentially constant.

The collector, or drain, current ($I_{CC,\ PEAKING}$) of the peaking amplifier 64 is approximately zero when the output power level is below the 6 dB backoff point, which corresponds to a value for the adjustable power control signal ($V_{RAMP}$) of less than essentially 0.85 V for this example. When the output power level increases above the 6 dB backoff point, the variable supply voltage V3 (FIG. 3) increases above the threshold voltage of the peaking amplifier 64. As a result, the collector current ($I_{CC,\ PEAKING}$) increases as a function of the variable supply voltage V3 and thus the adjustable power control signal ($V_{RAMP}$).

Figure 5:
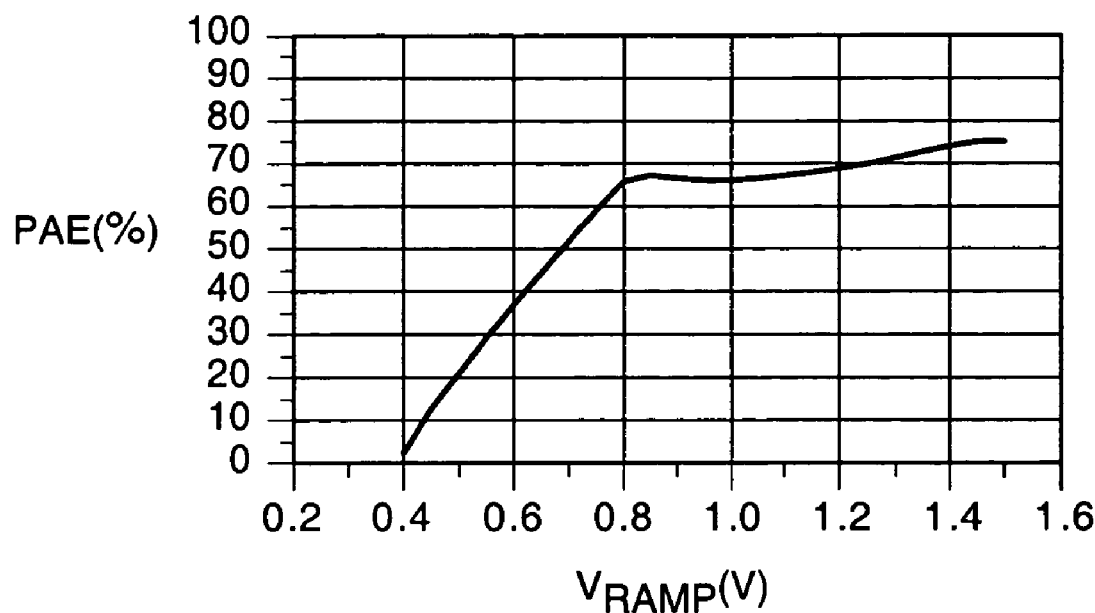
FIG. 5 is a graphical illustration of the Power Added Efficiency (PAE) of the output stage of the power amplifier circuitry of FIG. 2.

FIG. 5 illustrates the Power Added Efficiency (PAE) of the output amplifier stage 54 (FIG. 2) having the Doherty configuration described above. When the adjustable power control signal ($V_{RAMP}$) is in the range from 0 to 0.85 V, where 0.85 V is the value of $V_{RAMP}$ corresponding to the 6 dB backoff point for this example, the PAE of the output amplifier stage 54 is dominated by the PAE of the main amplifier 58. When the adjustable power control signal ($V_{RAMP}$) is greater than 0.85 V, the output power level is greater than the 6 dB backoff point, and the PAE of the output amplifier stage 54 is the combined efficiency of the main amplifier 58 and the peaking amplifier 64. However, due to the high efficiency of the main amplifier 58 when operating above the 6 dB backoff point, the PAE of the output amplifier stage 54 remains high and is relatively close to a maximum efficiency which occurs when operating at the maximum output power level.

Figure 6:
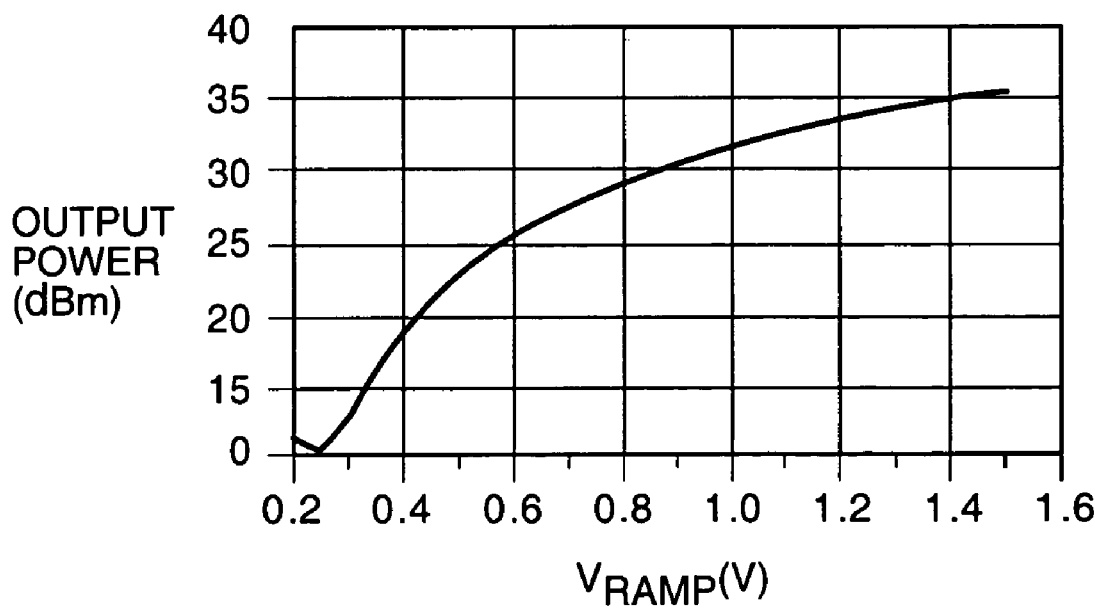
FIG. 6 is an exemplary graphical illustration of output power of the power amplifier circuitry versus an adjustable power control signal ($V_{RAMP}$)

FIG. 6 is a graphical illustration of the output power of the power amplifier circuitry 38 of the present invention versus the adjustable power control signal ($V_{RAMP}$). Note that this illustration is exemplary and is not intended to limit the scope of the present invention.

Figure 7:
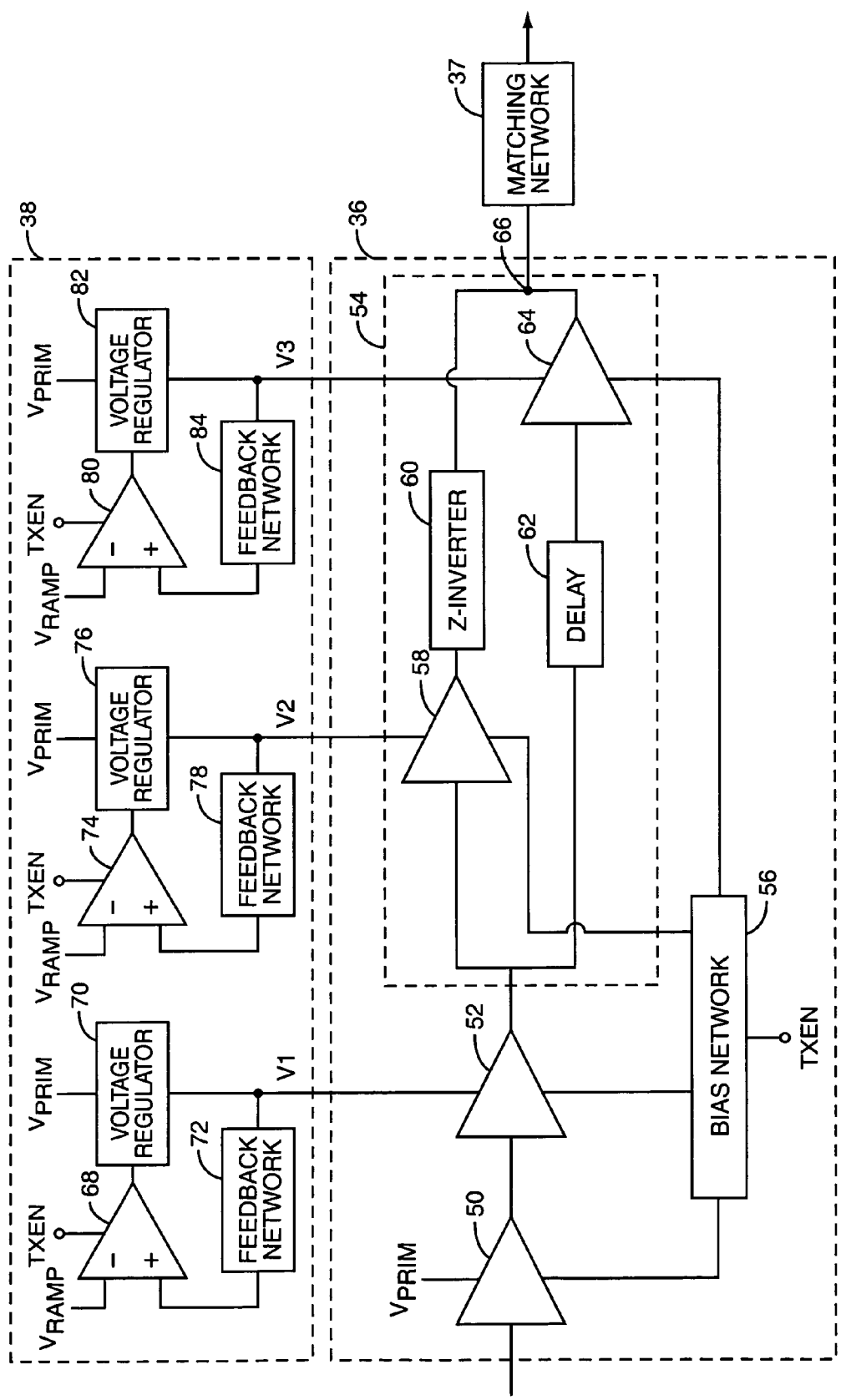
FIG. 7 is similar to FIG. 2 and provides a more detailed illustration of the power control circuitry according to one embodiment of the present invention.

FIG. 7 illustrates one embodiment of the power control circuitry 38 of FIG. 2. In this embodiment, the input amplifier stage 50 is connected to the fixed supply voltage ($V_{PRIM}$), and the power control circuitry 38 includes three power control sections each providing one of the variable supply voltages V1, V2, or V3 based on the adjustable power control signal ($V_{RAMP}$). The first power control section includes an error amplifier 68, a voltage regulator 70, and a feedback network 72. As noted, the power amplifier circuitry 36 provides gain for the modulated signal from the modulator 34 (FIG. 1) to be transmitted under control of the power control circuitry 36 based on the adjustable power control signal ($V_{RAMP}$).

In this exemplary embodiment, the adjustable power control signal ($V_{RAMP}$) is received by an inverting input of an operational amplifier forming error amplifier 68. The variable supply voltage V1 output by the voltage regulator 70 is fed back through the feedback network 72 and received by a non-inverting input of the error amplifier 68. A control signal from the error amplifier 68 is provided to a control input of the voltage regulator 70 to control the variable supply voltage V1 provided by the voltage regulator 70. The variable supply voltage V1 is provided to the intermediate amplifier stage 52 to control a gain of the intermediate amplifier stage 52 according to the adjustable power control signal ($V_{RAMP}$).

The second section of the power control circuitry 38 is similar to the first section and may include an error amplifier 74, a voltage regulator 76, and a feedback network 78. The adjustable power control signal ($V_{RAMP}$) is received by an inverting input of an operational amplifier forming the error amplifier 74. The variable supply voltage V2 output by the voltage regulator 76 is fed back through the feedback network 78 and received by a non-inverting input of the error amplifier 74. A control signal from the error amplifier 74 is provided to a control input of the voltage regulator 76 to control the variable supply voltage V2 provided by the voltage regulator 70. The variable supply voltage V2 is provided to the main amplifier 58 of the output amplifier stage 54 to control the operation of the main amplifier 58 according to the adjustable power control signal ($V_{RAMP}$). The error amplifier 74 and feedback network 78 are designed such that the variable supply voltage V2 provided to the main amplifier 58 increases from some minimum value at a minimum output power level to a maximum value at the 6 dB backoff point and is essentially constant when operating above the 6 dB backoff point, as discussed above.

The third section of the power control circuitry 38 is similar to the first and second sections and may include an error amplifier 80, a voltage regulator 82, and a feedback network 84. The adjustable power control signal ($V_{RAMP}$) is received by an inverting input of an operational amplifier forming the error amplifier 80. The variable supply voltage V3 output by the voltage regulator 82 is fed back through the feedback network 84 and received by a non-inverting input of the error amplifier 80. A control signal from the error amplifier 80 is provided to a control input of the voltage regulator 82 to control the variable supply voltage V3 provided by the voltage regulator 82. The variable supply voltage V3 is provided to the peaking amplifier 64 of the output amplifier stage 54 to control the operation of the peaking amplifier 64 according to the adjustable power control signal ($V_{RAMP}$). The error amplifier 80 and feedback network 84 are designed such that the variable supply voltage V3 provided to the peaking amplifier 64 increases as a function of the adjustable power control signal ($V_{RAMP}$) from some minimum value to a maximum value, as shown in FIG. 3. The variable supply voltage V3 is essentially equal to a threshold, or turn-on, voltage of the peaking amplifier 64 when the adjustable power control signal ($V_{RAMP}$) is at a value corresponding to the 6 dB backoff point.

Figure 8:
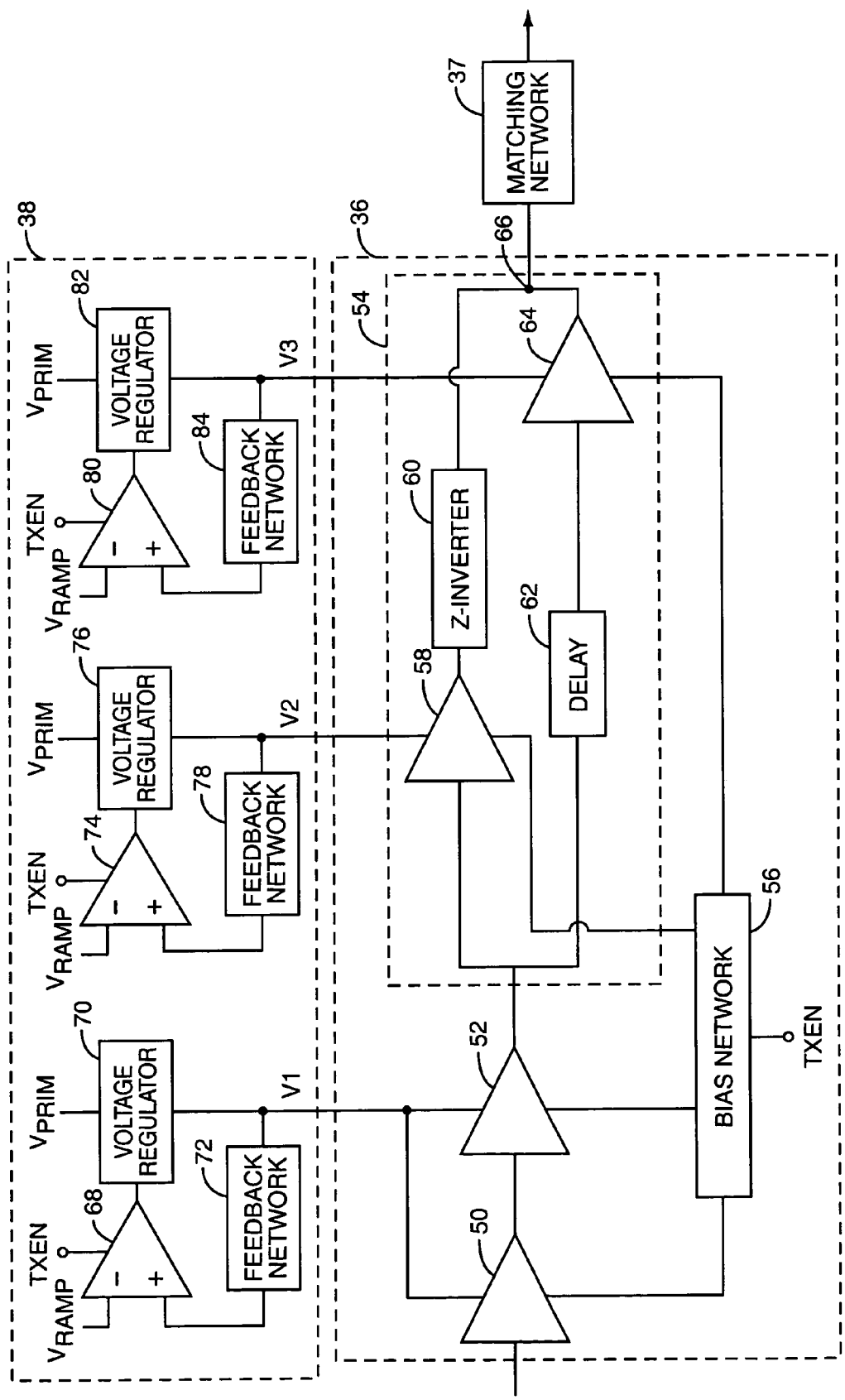
FIG. 8 illustrates the power amplifier circuitry according to another embodiment of the present invention.

FIG. 8 illustrates another embodiment of the present invention. This embodiment is substantially the same as the embodiment illustrated in FIG. 7. However, in this embodiment, the input amplifier stage 50 receives the variable supply voltage V1 rather than the fixed supply voltage ($V_{PRIM}$). Alternatively, the power control circuitry 38 may include a fourth section (not shown) operating to provide a fourth variable supply voltage for controlling the input amplifier stage 50.

Certain advantages may be realized by forming two or more of the amplifier stages 50, 52, and 54 from a plurality of transistor cells arranged in parallel. In an exemplary embodiment, the input amplifier stage 50 comprises a single transistor cell; the intermediate amplifier stage 52 comprises approximately six transistor cells; and the output amplifier stage 54 comprises forty-eight transistor cells split equally between the main amplifier 58 and the peaking amplifier 64. For further information pertaining to the transistor arrays, reference is made to U.S. Pat. No. 5,608,353, entitled HBT POWER AMPLIFIER, issued Mar. 4, 1997; and U.S. Pat. No. 5,629,648, entitled HBT POWER AMPLIFIER, issued May 13, 1997, which are commonly owned and assigned to RF Micro Devices, Inc. of 7628 Thorndike Road, Greensboro, N.C. 27409, and wherein the disclosures are incorporated herein by reference in their entireties.

Exemplary bias networks 56 capable of being used in association with the present invention are described in further detail in U.S. Pat. No. 6,313,705, entitled BIAS NETWORK FOR HIGH EFFICIENCY RF LINEAR POWER AMPLIFIER, issued Nov. 6, 2001, the disclosure of which is incorporated herein by reference in its entirety. Upon understanding the present invention, those skilled in the art will be able to construct any number of bias networks that are compatible with the present invention.

FIGS. 9A-9D illustrate exemplary embodiments of the final amplifier stage 54, wherein each of these embodiments are designed to present the same ultimate impedance to the main and peaking amplifiers 58 and 64 at full power. In these examples, the ultimate impedance is the equivalent of 2 ohms to a single large output transistor.

Figure 9A:
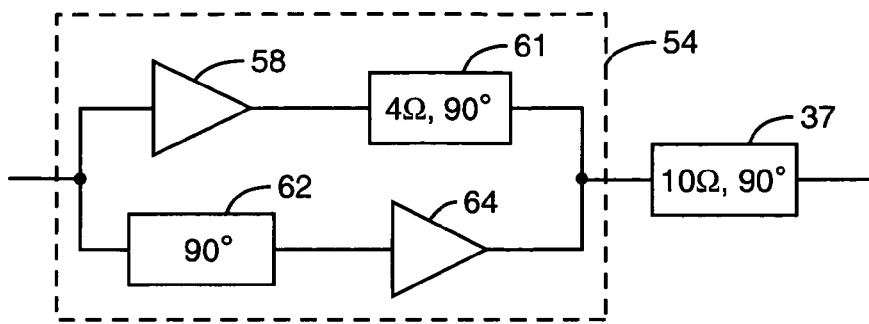
FIGS. 9A-9D illustrate exemplary alternative embodiments of the final amplifier stage of FIGS. 2 and 8 configured in Doherty amplifier arrangements according to the present invention.
Figure 9B:
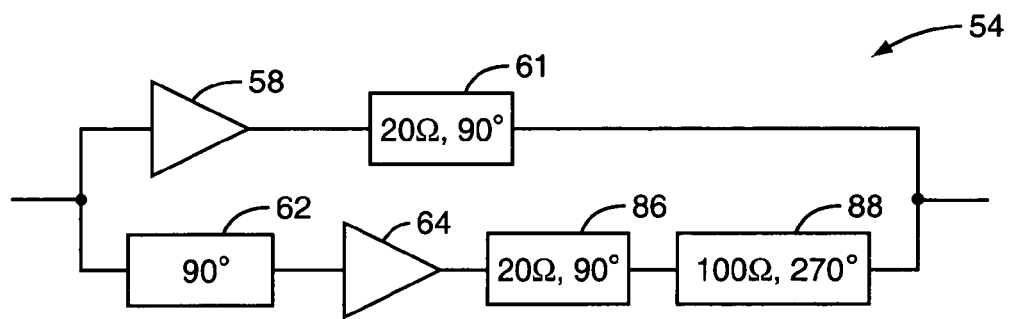

FIG. 9A illustrates an embodiment of the final amplifier stage similar to that shown in FIGS. 2 and 8. FIG. 9B illustrates an alternative embodiment having higher impedance inverters, or transformers, but long line lengths. Note that in FIG. 9B the output matching network 37 is not needed due to impedance inverters 86 and 88. Impedance inverter circuitry 86 is a quarter wave transmission line having a characteristic impedance of 20 ohms, and impedance inverter circuitry 88 is a three quarter wave transmission line having a characteristic impedance of 100 ohms.

Figure 9C:
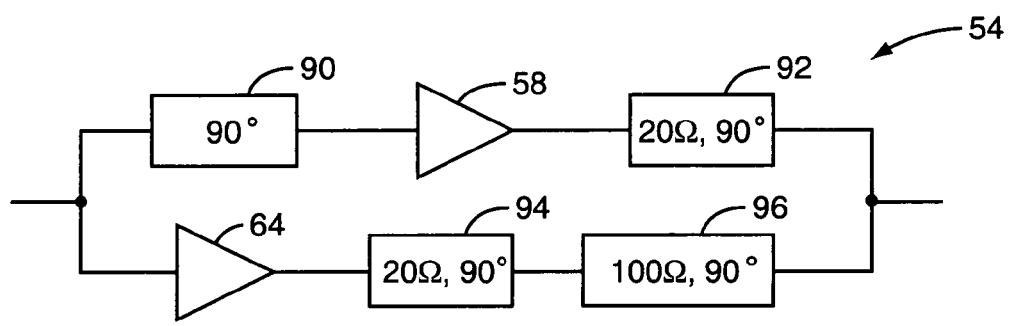
Figure 9D:
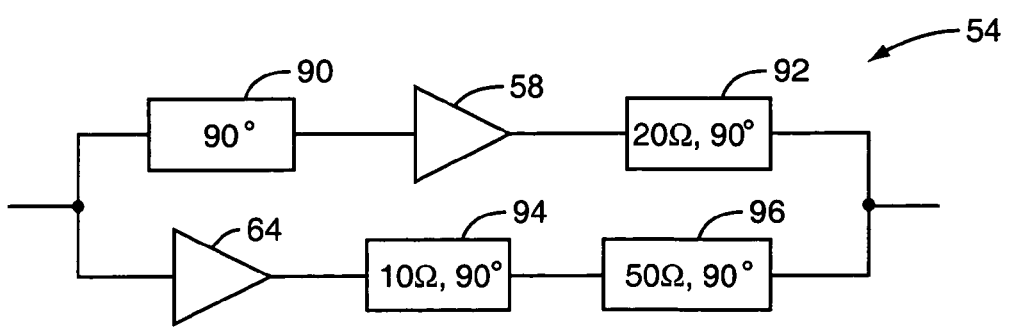

FIGS. 9C and 9D illustrate alternative embodiments where the delay occurs in the main branch rather than the peaking branch. More specifically, FIG. 9C illustrates an embodiment of the final amplifier stage 54 including 90 degree delay 90, main amplifier 58, and impedance inverter circuitry 92 in the main branch and the peaking amplifier 64 and impedance inverter circuits 94 and 96 in the peaking branch. The embodiment of FIG. 9C includes higher impedance inverter circuits 92, 94, and 96, but shorter line lengths than the line lengths in FIG. 9B. FIG. 9D illustrates an alternative to FIG. 9C wherein the impedance inverter circuits 92, 94, and 96 have moderate impedances.

The present invention provides substantial opportunity for variation without departing from the spirit or scope of the present invention. For example, the discussion above primarily focuses on the embodiment in which the output amplifier stage 54 is configured in a symmetric Doherty amplifier arrangement such that the predetermined backoff point is the 6 dB backoff point. The output amplifier stage 54 may alternatively be assymetrical, where the main and peaking amplifiers 58 and 64 are designed differently, such that the predetermined backoff point is any desired backoff point, such as a 10 dB backoff point. However, if the backoff point is increased, a larger dip in the PAE versus $V_{RAMP}$ curve will occur immediately after the increased backoff point. As another example, the output amplifier stage 54 is illustrated as having a Doherty amplifier configuration. However, in another embodiment, both the intermediate amplifier stage 52 and the output amplifier stage 54 may be configured in a Doherty amplifier arrangement.

Those skilled in the art will recognize improvements and modifications to the preferred embodiments of the present invention. All such improvements and modifications are considered within the scope of the concepts disclosed herein and the claims that follow.

What is claimed is:

1. A system comprising:
    power amplifier circuitry having an output stage comprising a main amplifier controlled by a first variable supply voltage and a peaking amplifier connected in parallel with the main amplifier and controlled by a second variable supply voltage, wherein the peaking amplifier operates essentially 90 degrees out-of-phase with the main amplifier, and wherein the main amplifier comprises a first plurality of transistors and the first variable supply voltage is provided to a collector of each of the first plurality of transistors, and the peaking amplifier comprises a second plurality of transistors and the second variable supply voltage is provided to a collector of each of the second plurality of transistors.

2. The system of claim 1 further comprising power control circuitry adapted to:
    provide the first variable supply voltage based on an adjustable power control signal such that the first variable supply voltage increases from a minimum value to a maximum value as the adjustable power control signal increases from a minimum value to a value corresponding to a desired backoff from a maximum output power level and is approximately the maximum value for values of the adjustable power control signal corresponding to output power levels greater than the desired backoff from the maximum output power level; and
    provide the second variable supply voltage based on the adjustable power control signal such that the peaking amplifier is inactive for values of the adjustable power control signal corresponding to output power levels less than the desired backoff from the maximum output power level and active for values of the adjustable power control signal corresponding to output power levels greater than the desired backoff from the maximum output power level.

3. The system of claim 2 wherein the power control circuitry is further adapted to provide the second variable supply voltage such that the second variable supply voltage increases as a function of the adjustable power control signal.

4. The system of claim 1 wherein the output stage comprises:
    the main amplifier controlled by the first variable supply voltage and adapted to amplify a radio frequency input signal based on the first variable supply voltage;
    the peaking amplifier controlled by the second variable supply voltage and adapted to amplify a phase-shifted version of the radio frequency input signal based on the second variable supply voltage, wherein the phase-shifted version of the radio frequency input signal is essentially 90 degrees out-of phase with the radio frequency input signal; and
    impedance inverter circuitry having a first terminal coupled to an output of the main amplifier and a second terminal coupled to an output of the peaking amplifier, the impedance inverter circuitry operating as an active load having an impedance that is a function of output currents of the main and peaking amplifiers and adapted to phase-shift a first amplified signal output by the main amplifier to provide a phase-shifted version of the first amplified signal, wherein the phase-shifted version of the first amplified signal is combined with a second amplified signal output by the peaking amplifier to provide an amplified radio frequency signal.

5. The system of claim 2 wherein the adjustable power control signal comprises an amplitude modulation component.

6. The system of claim 1 wherein the power amplifier circuitry further comprises an input stage coupled in series with the output stage and receiving a fixed supply voltage from a fixed voltage node.

7. The system of claim 6 wherein the power amplifier circuitry further comprises an intermediate stage coupled in series between the input stage and the output stage and controlled by a third variable supply voltage.

8. The system of claim 1 wherein the power amplifier circuitry further comprises an input stage coupled in series with the output stage and controlled by a third variable supply voltage.

9. The system of claim 8 wherein the power amplifier circuitry further comprises an intermediate stage coupled in series between the input stage and the output stage and controlled by the third variable supply voltage.

10. A method of amplifying a radio frequency signal comprising:
    providing power amplifier circuitry having an output stage comprising a main amplifier controlled by a first variable supply voltage and a peaking amplifier connected in parallel with the main amplifier and controlled by a second variable supply voltage, wherein the peaking amplifier operates essentially 90 degrees out-of-phase with the main amplifier;
    providing the first variable supply voltage for controlling the main amplifier based on an adjustable power control signal;
    providing the second variable supply voltage for controlling the peaking amplifier based on an adjustable power control signal;
    providing the first variable supply voltage to a collector of each of a first plurality of transistors forming the main amplifier; and
    providing the second variable supply voltage to a collector of each of a second plurality of transistors forming the peaking amplifier.

11. The method of claim 10 wherein providing the first variable supply voltage comprises providing the first variable supply voltage based on the adjustable power control signal such that the first variable supply voltage increases from a minimum value to a maximum value as the adjustable power control signal increases from a minimum value to a value corresponding to a desired backoff from a maximum output power level and is approximately the maximum value for values of the adjustable power control signal corresponding to output power levels greater than the desired backoff from the maximum output power level.

12. The method of claim 11 wherein providing the second variable supply voltage comprises providing the second variable supply voltage based on the adjustable power control signal such that the peaking amplifier is inactive for values of the adjustable power control signal corresponding to output power levels less than the desired backoff from the maximum output power level and active for values of the adjustable power control signal corresponding to output power levels greater than the desired backoff from the maximum output power level.

13. The system of claim 12 wherein providing the second variable supply voltage comprises providing the second variable supply voltage such that the second variable supply voltage increases as a function of the adjustable power control signal.

14. The method of claim 10 wherein providing the power amplifier circuitry comprises configuring the main amplifier and the peaking amplifier as a Doherty amplifier.

15. The method of claim 10 further comprising providing the adjustable power control signal such that the adjustable power control signal comprises an amplitude modulation component.

16. The method of claim 10 wherein providing the power amplifier circuitry further comprises providing an input stage coupled in series with the output stage and providing a fixed supply voltage from a fixed voltage node to the input stage.

17. The method of claim 10 wherein providing the power amplifier circuitry further comprises providing an input stage coupled in series with the output stage and controlling the input stage using a third variable supply voltage.

18. The method of claim 17 wherein providing the power amplifier circuit further comprises providing an intermediate stage coupled in series between the input stage and the output stage and controlled by the third variable supply voltage.

* * * * *